(12) United States Patent
Uchida et al.

(10) Patent No.: US 6,900,483 B2
(45) Date of Patent: May 31, 2005

(54) SEMICONDUCTOR DEVICE AND METHOD FOR MANUFACTURING THE SAME

(75) Inventors: Masao Uchida, Ibaraki (JP); Makoto Kitabatake, Nara (JP); Toshiya Yokogawa, Nara (JP); Osamu Kusumoto, Nara (JP); Kunimasa Takahashi, Ibaraki (JP); Ryoko Miyanaga, Nara (JP); Kenya Yamashita, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/162,503

(22) Filed: Jun. 4, 2002

(65) Prior Publication Data

US 2002/0179909 A1 Dec. 5, 2002

(30) Foreign Application Priority Data

Jun. 4, 2001 (JP) ........................................ 2001-167970

(51) Int. Cl.[7] .............................................. H01L 29/80
(52) U.S. Cl. ...................... 257/280; 257/109; 257/281; 438/169; 438/534
(58) Field of Search ................................. 438/167, 169

(56) References Cited

U.S. PATENT DOCUMENTS 5,554,859 A * 9/1996 Tsukamoto et al. ............ 257/10
5,814,832 A * 9/1998 Takeda et al. ................ 257/10
5,895,260 A   4/1999 Bhatnagar et al.

FOREIGN PATENT DOCUMENTS

JP     58-210666      12/1983
WO     WO 00/13236    3/2000

OTHER PUBLICATIONS

Itoh, Akira et al.; "Excellent Reverse Blocking Characteristics of High–Voltage 4H–SiC Schottky Rectifiers with Boron–Implanted Edge Termination"; Electron Device Letters; vol. 17, No. 3, Mar. 1996.
Saxena, Vik et al.; "High–Voltage Ni– and Pt–SiC Schottky Diodes Utilizing Metal Field Plates Termination"; IEEE Transaction on Electron Devices; vol. 46, No. 3; Mar. 1999.
Wahab, Q. et al.; "A 3 kv Schottky Barrier Diode in 4H–SiC"; Appl. Ohys. Lett. 72(4); Jan. 26, 1998.
C.E. Weitzel; "A Review of GaAs MESFET Gate Electrode Fabrication Technologies"; Journal of the Electrochemical Society; pp. 409C–416C; USA; 1986.
European Patent Office Communication regarding Patent App. No. EP 02012326; Mailed Mar. 26, 2004.

* cited by examiner

*Primary Examiner*—Long Pham
*Assistant Examiner*—Wai-Sing Louie
(74) *Attorney, Agent, or Firm*—Harness, Dickey & Pierce, P.L.C.

(57) ABSTRACT

A Schottky diode includes a semiconductor substrate made of 4H—SiC, an epitaxially grown 4H—SiC layer, an ion implantation layer, a Schottky electrode, an ohmic electrode, and an insulative layer made of a thermal oxide film. The Schottky electrode and the insulative layer are not in contact with each other, with a gap being provided therebetween, whereby an altered layer does not occur. Therefore, it is possible to suppress the occurrence of a leak current.

25 Claims, 8 Drawing Sheets

Ion Implantation

SEMICONDUCTOR DEVICE AND METHOD FOR MANUFACTURING THE SAME

BACKGROUND OF THE INVENTION

The present invention relates to a semiconductor device using a silicon carbide layer, and more particularly to a silicon carbide semiconductor device that is capable of operating with a large current and has a high voltage resistance, and a method for manufacturing the same.

Silicon carbide (SiC) is a semiconductor having a higher hardness and a wider band gap than silicon (Si), and is used in power devices, environment resistant devices, high-temperature devices, high-frequency devices, etc.

A commonly-used power device is a switching device using Si. In a case where a switching device is used as a rectifier device, the device needs to have some voltage resistance. Therefore, a pn diode is used. However, a pn diode has a large switching loss. In view of this, a Schottky diode having a smaller switching loss is desirable. However, due to the physical limitation of Si, when a Schottky diode is formed by using Si, a desirable voltage resistance cannot be obtained. Thus, for realizing a switching device having a high voltage resistance and a small switching loss, SiC having a wide band gap has been attracting public attention.

FIG. 8 is a cross-sectional view illustrating a typical Schottky diode using SiC, which is a commonly-used switching device, of a first conventional example. As illustrated in FIG. 8, a Schottky diode 80 of the first conventional example includes a semiconductor substrate 81 made of n-type 4H—SiC, an n-type 4H—SiC layer 82 epitaxially grown on the upper surface of the semiconductor substrate 81, an ion implantation layer 83 into which boron, aluminum, or the like, is implanted, a Schottky electrode 84 made of nickel, titanium, or the like, provided on the upper surface side of the substrate and forming a Schottky barrier with the 4H—SiC layer 82, an ohmic electrode 85 made of nickel and provided on the reverse surface side of the semiconductor substrate 81, and an insulative layer 86 surrounding the Schottky electrode 84.

Herein, the ion implantation layer 83 is necessary for forming a guard ring structure for reducing the localization of an electric field, and is in contact with a portion of the Schottky electrode 84 along an interface 87. The ion implantation layer 83 functions to reduce the localization of an electric field occurring when a high voltage is applied between the Schottky electrode 84 and the ohmic electrode 85 so that the Schottky electrode 84 is on the negative side and the ohmic electrode 85 is on the positive side.

FIG. 9 is a cross-sectional view illustrating a typical Schottky diode using SiC, which is a commonly-used switching device, of a second conventional example. As illustrated in FIG. 9, a Schottky diode 90 of the second conventional example includes the semiconductor substrate 81 made of n-type 4H—SiC, the n-type 4H—SiC layer 82 epitaxially grown on the upper surface of the semiconductor substrate 81, the ion implantation layer 83 into which boron, aluminum, or the like, is implanted, a Schottky electrode 91 made of nickel, titanium, or the like, provided on the upper surface side of the substrate and forming a Schottky barrier with the 4H—SiC layer 82, the ohmic electrode 85 made of nickel and provided on the reverse surface side of the semiconductor substrate 81, and the insulative layer 86 surrounding the Schottky electrode 91. In contrast to the Schottky diode 80 of the first conventional example, the Schottky electrode 91 of the Schottky diode 90 of the second conventional example extends over a portion of the upper surface of the insulative layer 86.

The ion implantation layer 83 is necessary for forming a guard ring structure for reducing the localization of an electric field, and is in contact with a portion of the Schottky electrode 91 along an interface 92. The ion implantation layer 83 functions to reduce the localization of an electric field occurring when a high voltage is applied between the Schottky electrode 91 and the ohmic electrode 85 so that the Schottky electrode 91 is on the negative side and the ohmic electrode 85 is on the positive side.

Herein, in order for the ion implantation layer 83 to function as a guard ring in the Schottky diode 80 or 90 illustrated in FIG. 8 or FIG. 9, it is necessary to activate the implanted impurity such as boron through a high-temperature heat treatment. Specifically, in the process of manufacturing the Schottky diode 80 or 90, it is necessary to perform a heat treatment at a temperature higher than 1500° C. on the ion implantation layer 83 before forming the Schottky electrode 84 or 91.

Note that as disclosed in an article (Ito, et al., IEEE Electron Device Letters, Vol. 17, No. 3 (1996) pp139–141), for example, there are some reported cases in which the ion implantation layer 83 is subjected to a heat treatment at a relatively low temperature (1050° C.).

Moreover, in order to stabilize the characteristics of the Schottky electrode 84 or 91, a heat treatment at a temperature of about 400° C., for example, is performed before or after patterning a metal film forming the Schottky electrode 84 or 91.

However, it has been found that altered layers 88, 93 and 94 are formed in a region where the Schottky electrode 84 and the insulative layer 86 contact each other and in a region where the Schottky electrode 91 and the insulative layer 86 contact each other, as illustrated in FIG. 8 and FIG. 9. The altered layers 88, 93 and 94 are formed by the reaction between a metal of the Schottky electrode 84 or 91 and an insulative material of the insulative layer 86 occurring in a contact portion where the Schottky electrode 84 or 91 contacts the insulative layer 86 when performing a heat treatment on the Schottky electrode 84 or 91. If a significant electric field localization occurs in an area where the altered layer 88 or 93 contacts the insulative layer 86, a leak current may be induced, and the Schottky diode 80 or 90 may possibly be destroyed in some cases.

Moreover, if a heat treatment at a high temperature of 1500° C. or more is performed for activating the ion implantation layer 83, during the process of manufacturing the conventional Schottky diode 80 or 90, the surface of the 4H—SiC layer 82 may be roughened due to the influence of the high-temperature heat treatment, which may cause a leak current in the Schottky diode 80 or 90, and the various manufacturing process conditions may possibly change due to the loss of flatness of the surface. Moreover, if an impurity in the furnace attaches to the surface of the 4H—SiC layer 82 during the high-temperature heat treatment, a leak current may occur through the Schottky barrier due to the presence of an impurity at the interface between the 4H—SiC layer 82 and the Schottky electrode 84 or 91.

In order to prevent the roughening or contamination of the surface of the 4H—SiC layer 82, it is preferred to perform a heat treatment with a protection film such as an oxide film formed on the 4H—SiC layer 82. However, it is difficult to form a protection film that can withstand a heat treatment at a temperature as high as about 1500° C.

Furthermore, for performing a high-temperature heat treatment, a general-purpose apparatus cannot be used, but it is necessary to use a special-purpose high frequency induction heating apparatus such as an apparatus for growing a silicon carbide crystal. However, the use of such a high-temperature heating furnace requires some extra time for cooling, thereby lowering the throughput, and is thus disadvantageous in terms of the cost in mass production. Therefore, it is preferred to perform a heat treatment on the ion implantation layer 83 at a lower temperature. However, since the upper surface layer of the epitaxially grown layer 82 is damaged through the ion implantation process, the activation of the ion implantation layer 83 and the recovery of the crystal structure thereof may be insufficient if the heat treatment of the ion implantation layer is performed at a relatively low temperature.

A practical Schottky diode requires a forward current on the order of 1 A or more, and therefore requires a large electrode area. As a result, the area of the interface between the altered layer 88 or 93 and the ion implantation layer 83 is necessarily large. Therefore, the probability of a device breakdown due to the influence of the altered layer in the Schottky diode is not low.

Note that in some cases, the insulative layer 86 is absent in the structure illustrated in FIG. 8. However, in a case where the insulative layer 86 is absent, the majority of the ion implantation layer 83 is exposed to the outside, thereby leading to problems occurring during the assembly of the semiconductor device. For example, when a wire made of gold, aluminum, or the like, is connected to the Schottky electrode 84, the wire and the ion implantation layer 83 may contact each other, and the wire metal or the electrode metal may scatter, though in a slight amount, from the contact portion where the wire and the Schottky electrode 84 contact each other, if the ion implantation layer 83 is exposed. Therefore, a leak current or a device breakdown may occur unexpectedly.

SUMMARY OF THE INVENTION

An object of the present invention is to provide a semiconductor device using a silicon carbide layer in which the occurrence of a device breakdown or a leak current is reduced, and a method for manufacturing the same.

A semiconductor device of the present invention includes: a semiconductor layer made of silicon carbide; an ion implantation layer formed by implanting ion into the semiconductor layer; a Schottky electrode formed at least on a region of the semiconductor layer excluding the ion implantation layer; and an insulative layer formed on the ion implantation layer with a predetermined gap between the insulative layer and the Schottky electrode.

In this way, a gap is present between the Schottky electrode and the insulative layer, thereby realizing a structure that is free of an altered layer occurring through the reaction between the Schottky electrode and the insulative layer. Therefore, it is possible to suppress the occurrence of a leak current due to the presence of an altered layer in a semiconductor device. Thus, it is possible to suppress the breakdown of a semiconductor device occurring when, for example, a reverse bias is applied through the semiconductor device.

The Schottky electrode may be formed so as to extend over a region of the semiconductor layer excluding the ion implantation layer and the ion implantation layer.

The semiconductor device may further include an upper metal electrode formed on the Schottky electrode so as to be in contact with the Schottky electrode.

In such a case, the upper metal electrode may cover at least a portion of the insulative layer. In this way, the localization of an electric field in the Schottky barrier section is reduced, whereby it is possible to suppress the slight amount of leak current through the guard ring section.

The Schottky electrode may not be in contact with the ion implantation layer. In this way, it is possible to realize a significant effect of suppressing a leak current.

The Schottky electrode may be subjected to a heat treatment. In this way, the formation of the Schottky barrier can be ensured.

In a case where the semiconductor device further includes a substrate made of silicon carbide, it is preferred that the semiconductor layer is epitaxially grown on the substrate.

In a case where the semiconductor device further includes a substrate made of Si, it is preferred that the semiconductor layer is epitaxially grown on the substrate.

It is preferred that the semiconductor device functions as a Schottky diode.

A first method for manufacturing a semiconductor device of the present invention is a method for manufacturing a semiconductor device including a Schottky electrode that is in contact with a semiconductor layer made of silicon carbide, the method including the steps of: (a) implanting impurity ion to be a dopant into the semiconductor layer so as to form an ion implantation layer; and (b) forming an insulative layer on at least a portion of the ion implantation layer, wherein the step (b) is performed at a temperature of 1200° C. or less.

With this method, a high-temperature process is not required, whereby it is possible to suppress the surface roughness of the semiconductor layer, thereby simplifying the manufacturing process and improving the throughput.

The method may further include, before the step (b), the step of forming a protection film that covers at least a region of the semiconductor layer excluding the ion implantation layer. In this way, the surface of the semiconductor layer can be kept clean.

It is preferred that: the step of forming the protection film is performed before the step (a); and the protection film is a mask for the ion implantation in the step (a).

In the step (b), the insulative layer may be formed in a high-temperature atmosphere containing oxygen. In this way, the step (b) can function also as the step of activating the ion implantation layer.

In the step (b), the insulative layer may be formed by a deposition method.

A second method for manufacturing a semiconductor device of the present invention is a method for manufacturing a semiconductor device including a Schottky electrode that is in contact with a semiconductor layer made of silicon carbide, the method including the steps of: (a) forming an ion implantation mask on the semiconductor layer; (b) implanting impurity ion to be a dopant into the semiconductor layer from above the ion implantation mask so as to form an ion implantation layer; (c) forming an insulative layer on the ion implantation layer; (d) forming, on the insulative layer, a resist film having an opening in an area where the Schottky electrode is to be formed; (e) removing the ion implantation mask by isotropic etching using the resist film as a mask, and forming an opening in the insulative layer, the opening in the insulative layer being larger than the opening in the resist film; and (f) depositing a metal film from above the resist film and then removing the resist film so as to leave the Schottky electrode with a predetermined gap between the insulative layer and the Schottky electrode.

With this method, an insulative layer and a Schottky electrode opposing each other with a gap therebetween can be formed easily in a self-aligned process.

It is preferred that the method further includes the step of performing a heat treatment at a temperature of 1200° C. or less, after the step (b) and before the step (d).

DESCRIPTION OF THE PREFERRED EMBODIMENTS

First Embodiment

Figure 1:
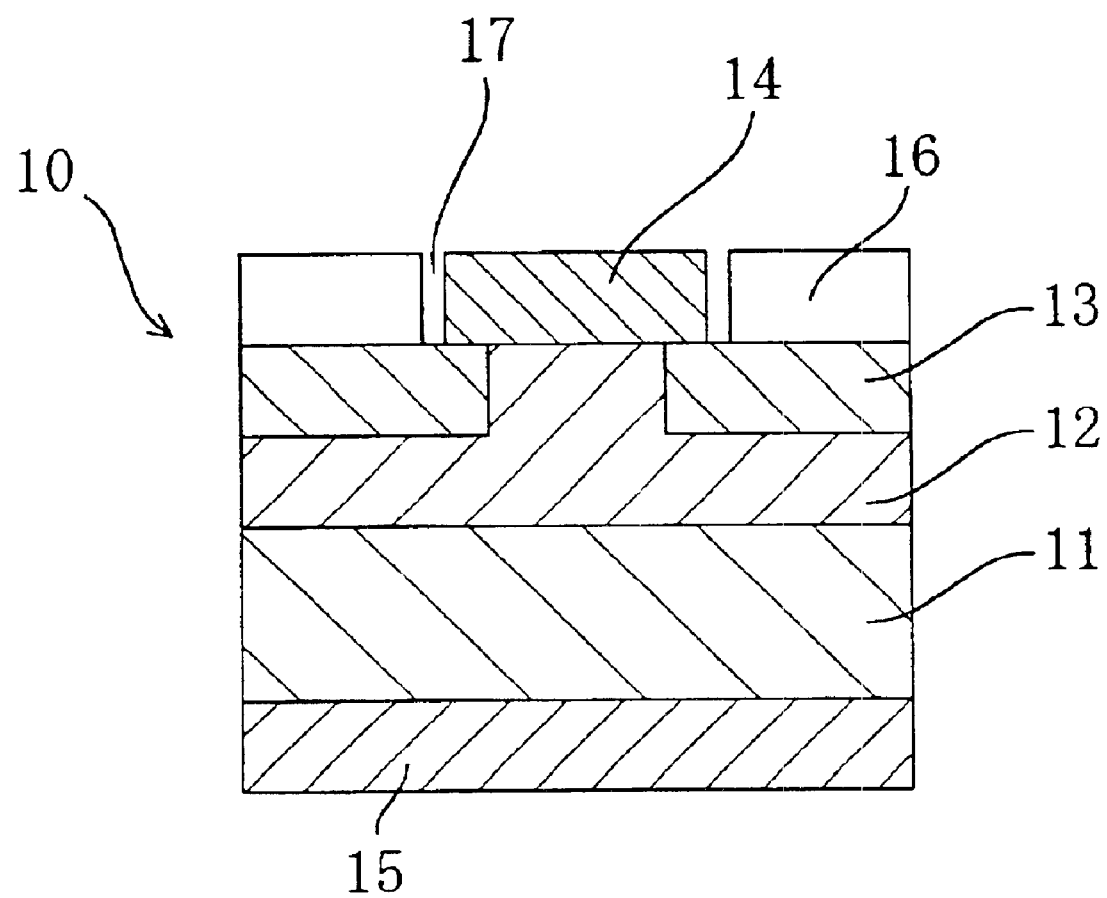
FIG. 1 is a cross-sectional view illustrating a Schottky diode according to the first embodiment of the present invention.

FIG. 1 is a cross-sectional view illustrating a semiconductor device (Schottky diode) according to the first embodiment of the present invention. As illustrated in FIG. 1, a Schottky diode 10 of the present embodiment includes a semiconductor substrate 11 made of n-type 4H—SiC, an n-type 4H—SiC layer 12 epitaxially grown on the upper surface of the semiconductor substrate 11, an ion implantation layer 13 formed by implanting boron into the 4H—SiC layer 12, a Schottky electrode 14 made of nickel, titanium, or the like, provided on the upper surface side of the substrate and forming a Schottky barrier with the 4H—SiC layer 12, an ohmic electrode 15 made of nickel and provided on the reverse surface side of the semiconductor substrate 11, and an insulative layer 16 made of a thermal oxide film and surrounding the Schottky electrode 14.

Also in the present embodiment, the ion implantation layer 13 is necessary for forming a guard ring structure for reducing the localization of an electric field, and is in contact with a portion of the Schottky electrode 14. The ion implantation layer 13 functions to reduce the localization of an electric field occurring when a high voltage is applied between the Schottky electrode 14 and the ohmic electrode 15 so that the Schottky electrode 14 is on the negative side and the ohmic electrode 15 is on the positive side.

Herein, a main feature of the Schottky diode 10 of the present embodiment is that the Schottky electrode 14 and the insulative layer 16 are not in contact with each other.

Figure 8:
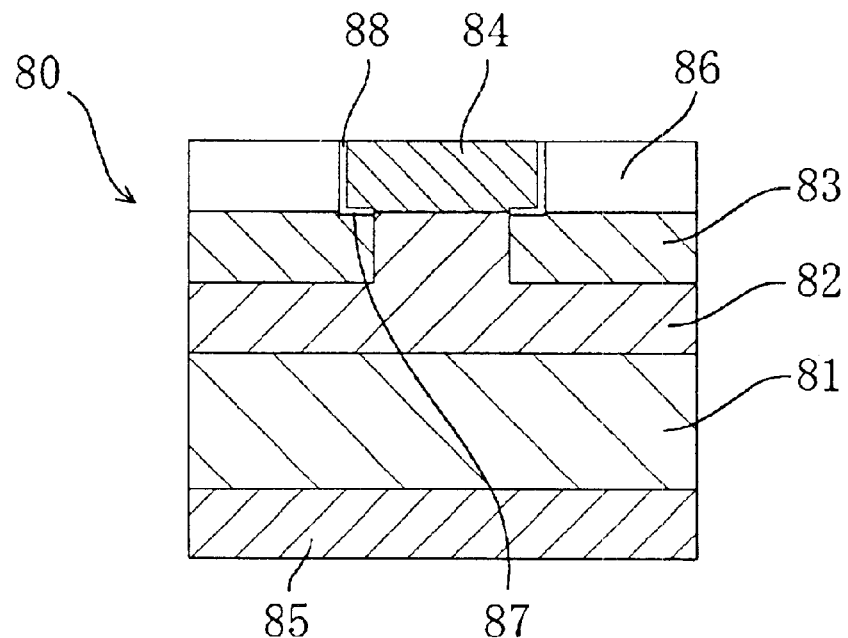
FIG. 8 is a cross-sectional view illustrating a typical Schottky diode using SiC, which is a commonly-used switching device, of a first conventional example.
Figure 9:
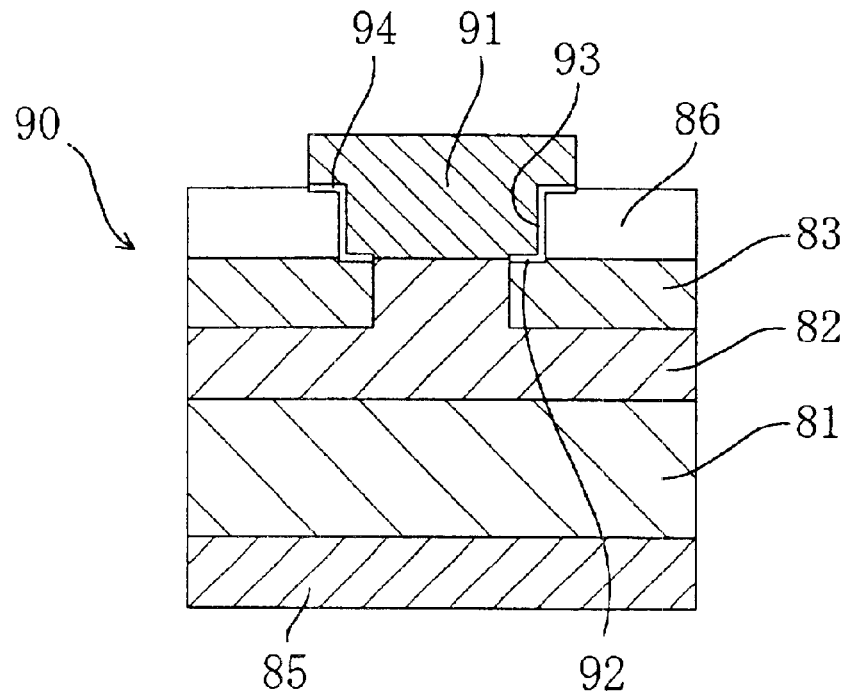
FIG. 9 is a cross-sectional view illustrating a typical Schottky diode using SiC, which is a commonly-used switching device, of a second conventional example.
Figure 3A:
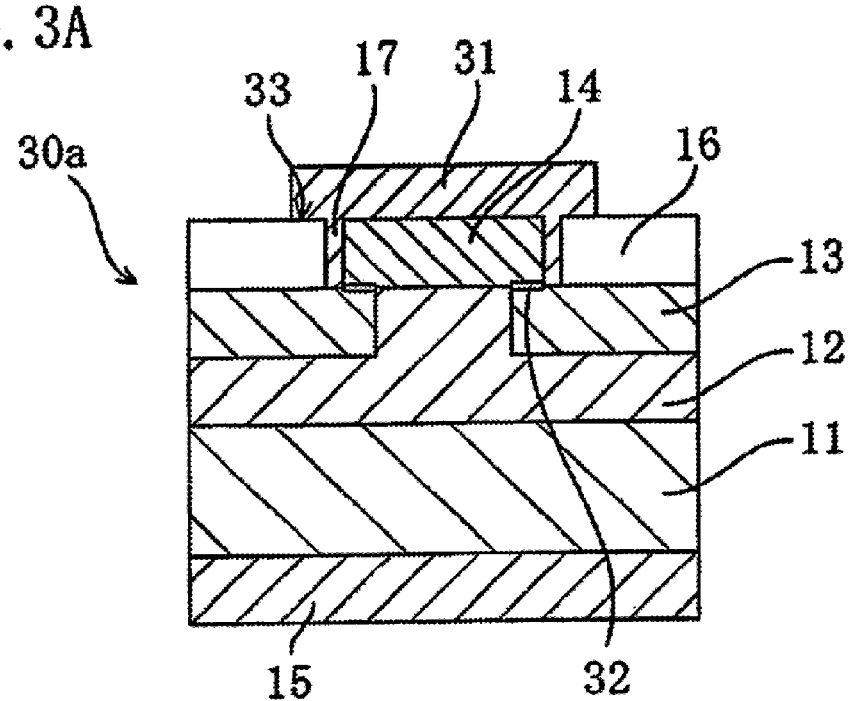
Figure 3B:
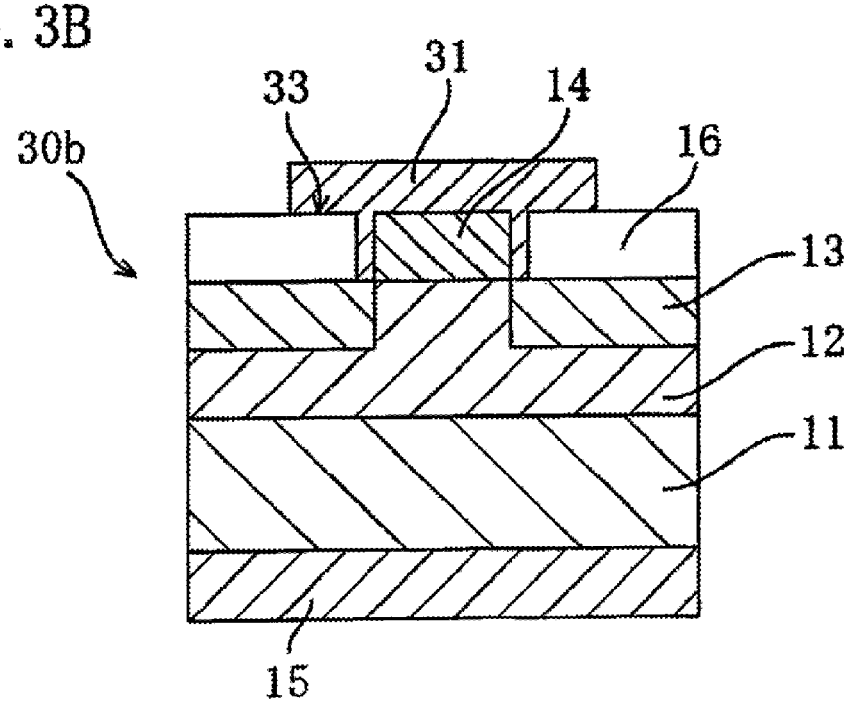
Figure 6A:
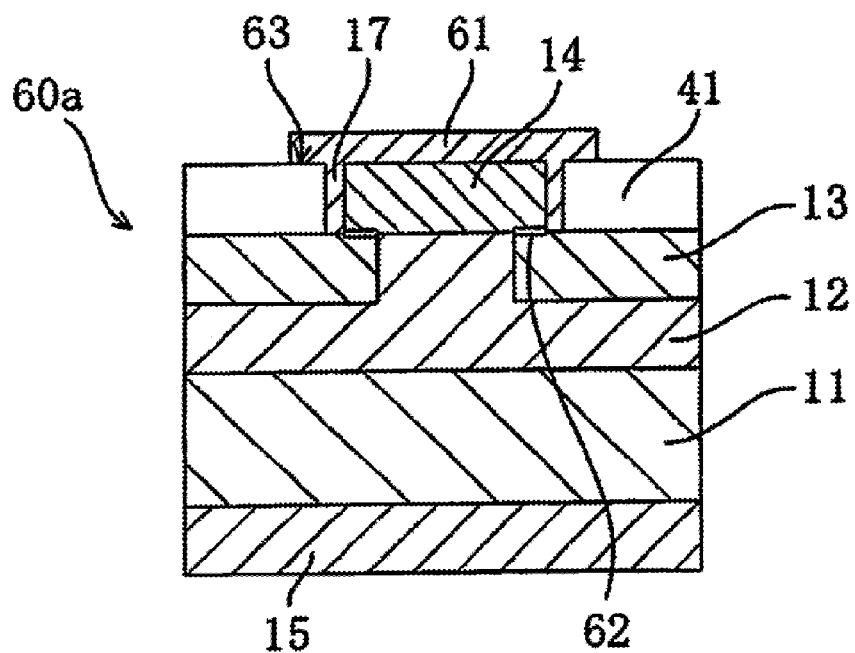
Figure 6B:
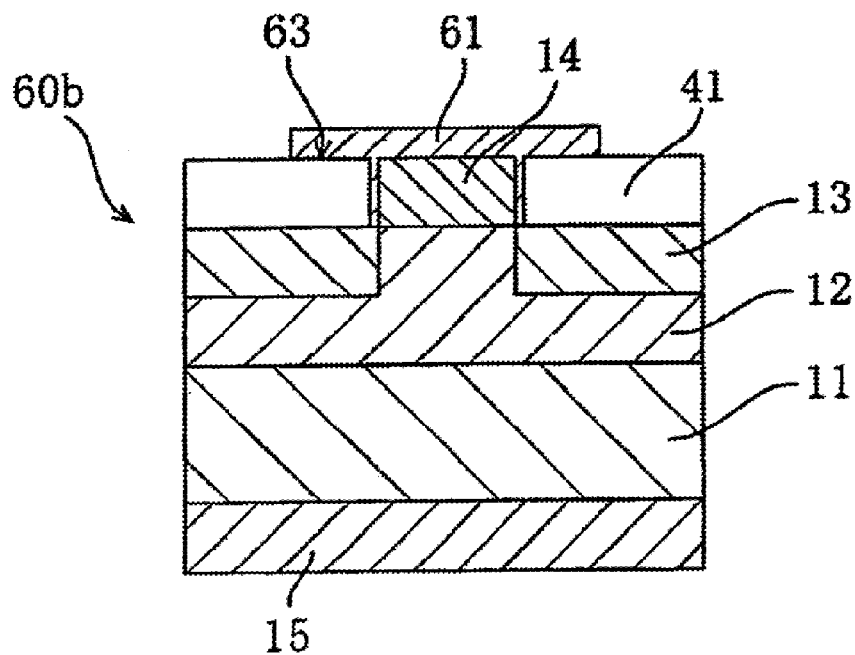

The present embodiment employs such a structure as described above in which the Schottky electrode 14 and the insulative layer 16 are not in contact with each other, with a gap 17 being provided therebetween, whereby the altered layers 88 or 93, 94 occurring in the conventional Schottky diode 80 or 90 as illustrated in FIG. 8 or FIG. 9 does not occur. Therefore, with the Schottky diode 10 of the present embodiment, it is possible to suppress the occurrence of a leak current.

Next, a method for manufacturing the Schottky diode 10 of the present embodiment will be described with reference to FIG. 2A to FIG. 2H.

Figure 2A:
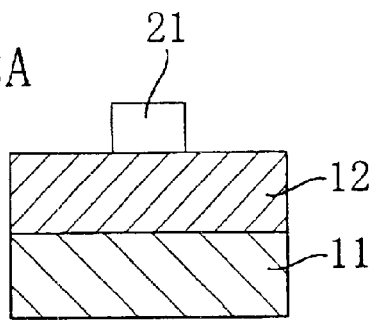
FIG. 2A to FIG. 2H are cross-sectional views illustrating a method for manufacturing the Schottky diode according to the first embodiment.

Before the step shown in FIG. 2A, the semiconductor substrate 11 made of 4H—SiC having a diameter of 2 inches whose principal plane is inclined by 8° from the (0001) plane toward the [11—20] direction is prepared. Then, the 4H—SiC layer 12 is epitaxially grown on the semiconductor substrate 11. The epitaxial growth process is performed by using propane as a carbon source, silane as a silicon source, hydrogen as a carrier gas, and nitrogen as a dopant. The 4H—SiC substrate 11 is an n-type substrate and has a specific resistance of about 0.02 Ω·m. The 4H—SiC layer 12 is an n-type layer, and has a carrier concentration of about $1\times10^{16}$ cm$^{-3}$ and a thickness of about 9 μm. At the end of the epitaxial growth process, a surface treatment is performed on the 4H—SiC layer 12 by using a high-temperature hydrogen atmosphere.

Then, in the step shown in FIG. 2A, an SiO$_2$ film having a thickness of about 800 nm is deposited on the 4H—SiC layer 12. Then, a resist mask is formed on the SiO$_2$ film through a photolithography process, and the SiO$_2$ film is etched with buffered hydrogen fluoride by using the resist mask so as to form an SiO$_2$ mask 21 having a diameter of 1 mm to be an implantation mask on the 4H—SiC layer 12. Then, the resist mask is removed.

Figure 2B:
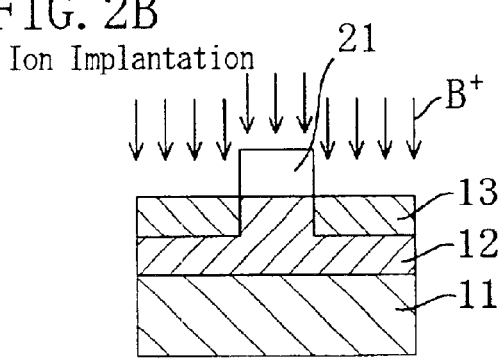

Then, in the step shown in FIG. 2B, boron ion (B$^+$) is implanted into the 4H—SiC layer 12 from above the SiO$_2$ mask 21. The ion implantation conditions include, for example, an inclination angle of 0°, an implantation energy of 30 keV, a dose of $1\times10^{15}$/cm$^2$, and a substrate temperature (during implantation) of 500° C. In this way, the ion implantation layer 13 is formed, as illustrated in FIG. 2B. In this process, boron is implanted also into the SiO$_2$ mask 21, but the SiO$_2$ mask 21 has a thickness such that boron ion does not penetrate through the SiO$_2$ mask 21 to reach the 4H—SiC layer 12 immediately under the SiO$_2$ mask 21.

Figure 2C:
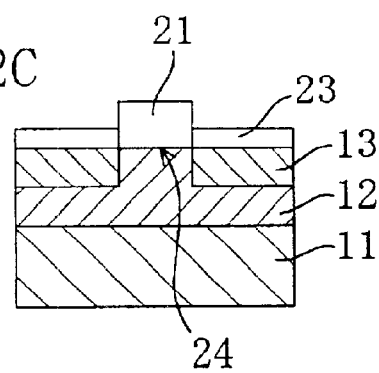

Then, in the step shown in FIG. 2C, the substrate is introduced into a resistance heating furnace with the SiO$_2$ mask 21 being left thereon, and a heat treatment is performed in a nitrogen atmosphere in the resistance heating furnace at 1100° C. for 90 minutes so as to activate the implanted boron in the ion implantation layer 13.

Then, the substrate is subjected to a thermal oxidation process in an oxygen atmosphere containing water vapor at 1100° C. for 60 minutes. In this way, a surface portion of the ion implantation layer 13 is thermally oxidized, thereby forming a thermal oxide film 23 having a thickness of about 20 nm on the ion implantation layer 13, as illustrated in FIG. 2C. In this process, due to the presence of the SiO$_2$ mask 21, a surface portion 24 of the ion implantation layer 13 that is in contact with the SiO$_2$ mask 21 is unlikely to be influenced by the thermal oxidization, and is hardly oxidized.

Figure 2D:
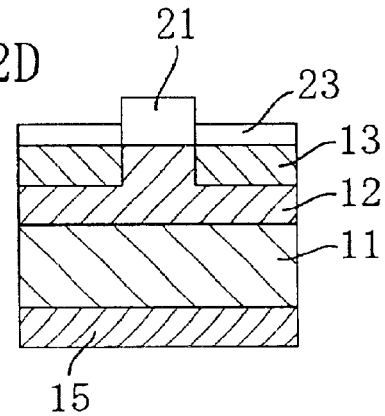

Then, in the step shown in FIG. 2D, a nickel film (Ni film) having a thickness of 40 nm is deposited on the reverse surface of the 4H—SiC substrate 11. The substrate having the Ni film deposited thereon is subjected to a heat treatment in a nitrogen atmosphere at 1000° C. for 5 minutes so as to form the ohmic electrode 15 made of Ni.

Figure 2E:
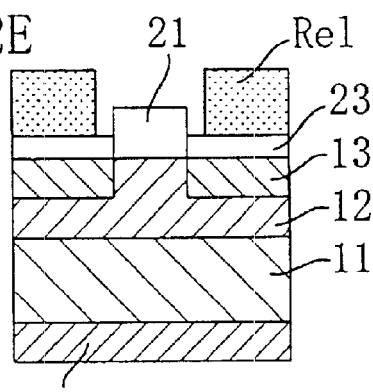

Then, in the step shown in FIG. 2E, a photolithography process is performed so as to form, on the thermal oxide film 23, a resist mask Re1 having an opening in a region where the Schottky electrode 14 is to be formed. The size of the opening in the resist mask Re1 is, for example, 1.04 mm in diameter, i.e., slightly larger than the SiO$_2$ mask 21.

Figure 2F:
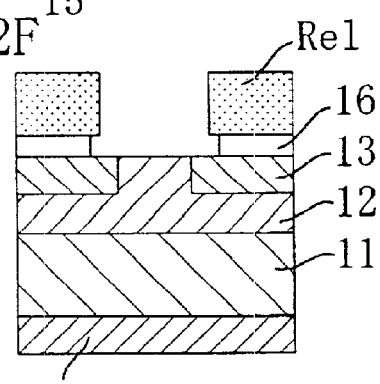

Next, in the step shown in FIG. 2F, the SiO$_2$ mask 21 is removed through a wet etching process using buffered hydrogen fluoride (BHF). In this process, a portion of the thermal oxide film 23 in the vicinity of the periphery of the opening in the resist mask Re1 is also etched. Thus, the thermal oxide film 23 is patterned so as to form the insulative layer 16 with an opening having a diameter of 1.041 mm, for example. Specifically, the wet etching process is continued even after the SiO$_2$ mask 21 is removed so as to form the insulative layer 16 having an opening that is larger than the opening in the resist mask Re1 (about 1.04 mm in diameter).

Figure 2G:
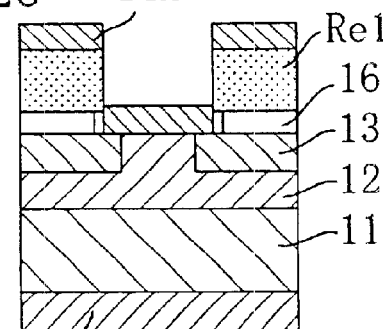

Then, in the step shown in FIG. 2G, electron beam evaporation is performed from above the resist mask Re1 so as to deposit an Ni film 14$x$ having a thickness of about 200 nm. In this process, the Ni film 14$x$ is deposited not only on the resist mask Re1 but also on the 4H—SiC layer 12 and the ion implantation layer 13 within the opening of the resist mask Re1.

Figure 2H:
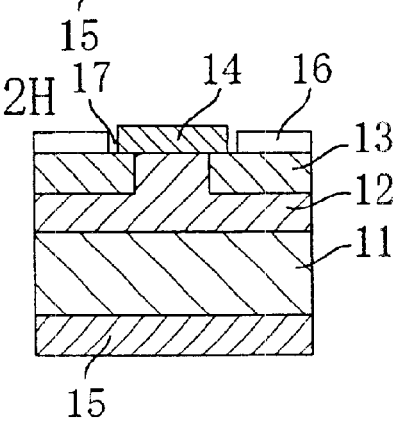

Then, in the step shown in FIG. 2H, the resist mask Re1 is lifted off so as to remove only a portion of the NI film that is on the resist mask Re1, thereby forming the Schottky electrode 14 on the 4H—SiC layer 12 including a portion of the ion implantation layer 13. As a result of this process, the gap 17 having a size of 0.5 $\mu$m is provided between the insulative layer 16 and the Schottky electrode 14 so as to separate them from each other. Then, the substrate is subjected to a heat treatment in a nitrogen atmosphere at 400° C. for 5 minutes so as to reliably form a Schottky barrier between the Schottky electrode 14 and the 4H—SiC layer 12.

Through these steps, the Schottky diode 10 illustrated in FIG. 1 can be easily formed.

Note that this structure can be formed alternatively as follows. For example, the thermal oxide film 23 is patterned, without forming the resist mask Re1 illustrated in FIG. 2E, so as to form an insulative layer having a slightly larger opening than that of the thermal oxide film 23 while removing the SiO$_2$ mask 21 at the same time, after which an Ni film is deposited and patterned on the substrate, thereby forming a Schottky electrode that is slightly smaller than the opening of the insulative layer. In such a case, however, a positional shift may occur between the mask used in the formation of the Schottky electrode and the mask used in the patterning of the thermal oxide film, whereby the dimension of the gap between the Schottky electrode and the thermal oxide film may vary from one location to another.

In contrast, with the manufacturing method of the present embodiment, the gap 17 having a substantially uniform dimension can easily be formed between the Schottky electrode 14 and the insulative layer 16 in a self-aligned process, as illustrated in FIG. 2G.

Moreover, the insulative layer 16 made of a thermal oxide film is formed with the SiO$_2$ mask 21 being left unremoved, whereby a damaged layer produced in a surface portion of the ion implantation layer 13 can be removed, while the surface of the 4H—SiC layer 12 immediately under the SiO$_2$ mask 21 is kept clean. Furthermore, since oxidation is promoted by the presence of the damaged layer, it is possible to form a relatively thick thermal oxide film.

Experiment

The following experiment was conducted in order to confirm the effects of the Schottky diode of the present embodiment.

A conventional Schottky diode as illustrated in FIG. 8 was also produced for the purpose of comparison. The conventional Schottky diode was different from the Schottky diode illustrated in FIG. 1 in that an SiO$_2$ layer made by a plasma CVD process was used as the insulative layer, and in that the insulator was wet-etched so as not to be over-etched, i.e., with the minimum etching time, so as to ensure the contact between the insulative layer 86 and the Schottky electrode 84. In the following description, the Schottky diode of the present embodiment will be referred to as "diode A" and the conventional Schottky diode as "diode B".

An evaluation of diodes A and B for the current-voltage characteristics (I-V characteristics) showed that there was substantially no difference therebetween in terms of the forward I-V characteristics, but there was a substantial difference therebetween in terms of the reverse I-V characteristics. For diode A, the percentage of devices that broke down upon application of a reverse voltage of −600 V was 10% or less. The breakdown is not due to the structure of the Schottky diode, but due to defects in the crystal of the semiconductor substrate 11 or the epitaxially grown 4H—SiC layer 12.

In contrast, diode B had a slightly larger amount of leak current than diode A, and substantially all of the devices broke down upon application of a reverse bias of −500 V or more. It is believed that the difference as described above occurs for the following reason.

For diode B, the ion implantation layer is activated at a relatively low temperature of 1100° C., whereby the damage caused by the ion implantation remains in the ion implantation layer, and the crystal defects are not completely restored. It is believed that in such a state, if the altered layer 88 as illustrated in FIG. 8 is in contact with the ion implantation layer 83, an electric field is likely to be localized in the area, which may cause a local leak current, whereby the device is likely to break down. In contrast, for diode A, it is believed that the insulative layer 16 and the Schottky electrode 14 are not in contact with each other, as illustrated in FIG. 1, whereby an altered layer is not formed, resulting in the low breakdown probability.

Of course, in the conventional Schottky diode 80, the ion implantation layer 83 can be activated sufficiently through a heat treatment at a higher temperature, in which case the breakdown probability decreases. However, also when a heat treatment at a higher temperature is performed, a structure with no altered layer as that of the present embodiment has less leak current and a lower breakdown probability. Note however that when the surface roughness is increased by a heat treatment at an excessively high temperature, problems associated with the surface roughness as those set forth above in the description of the prior art will occur. Therefore, a heat treatment at such a high temperature should be avoided.

First Process Variation of First Embodiment

In the first embodiment, the thermal oxide film is formed after subjecting the ion implantation layer 13 to a heat treatment at 1100° C. Alternatively, the heat treatment step and the thermal oxidation step may be performed in the same apparatus. For example, according to the first process variation of the first embodiment, after the ion implantation layer 13 is formed as illustrated in FIG. 2B in the process of manufacturing a Schottky diode according to the first embodiment, the substrate is introduced into a thermal oxidization furnace. Then, an inert gas such as argon or nitrogen is introduced into the thermal oxidization furnace, and the temperature is increased to 1100° C. and then kept at 1100° C. for a predetermined period of time. The ion implantation layer 13 is activated through such a heat treatment. Then, the inert gas atmosphere is substituted with an oxygen-containing atmosphere, and the process directly transitions to the thermal oxidization step. In this way, the ion implantation layer 13 and the thermal oxide film 23 are formed successively. Thus, the manufacturing process can be shortened.

Second Process Variation of First Embodiment

In the first process variation of the first embodiment, the heat treatment step for the ion-implanted 4H—SiC layer and the thermal oxidization step are performed in the same apparatus. Alternatively, the heat treatment step and the thermal oxidization step may be performed simultaneously. For example, according to the second process variation of the first embodiment, after the ion implantation layer 13 is formed as illustrated in FIG. 2B in the process of manufacturing a Schottky diode as set forth in the first process variation of the first embodiment, the substrate is introduced into a thermal oxidization furnace and subjected to a heat treatment at a predetermined temperature in an oxygen-containing atmosphere without changing the atmosphere. In this way, the activation of the ion implantation layer 13 (through the heating in the oxygen atmosphere) and the formation of the thermal oxide film 23 are performed simultaneously. Of course, if the heat treatment time is insufficient, an additional heat treatment may be performed with the oxygen-containing atmosphere being substituted with an inert gas atmosphere, for example. In this way, the manufacturing process can be further shortened. However, in a case where the heat treatment step and the thermal oxidization step are performed simultaneously, the ion implantation layer 13 may be entirely thermally oxidized due to the damage in the ion implantation layer 13 caused by the ion implantation. In view of this, it is preferred that the ion implantation energy is increased or a multi-step implantation process is employed so as to increase the implantation depth of the ion implantation layer 13, thereby avoiding thermal oxidization of the entirety of the ion implantation layer 13.

Moreover, in the method for manufacturing a semiconductor device of the present embodiment, the heat treatment process and the thermal oxidization process after ion implantation are performed at a temperature of 1100° C. If a general-purpose resistance heating furnace, a general-purpose ramp annealing apparatus or a general-purpose thermal oxidization furnace can be used, it is not necessary to use any other special-purpose heating apparatus. In view of this, it is preferred that the heat treatment process and the thermal oxidization process after ion implantation are performed at a temperature of 1200° C. or less.

First and Second Structure Variations of First Embodiment

Figure 3A:
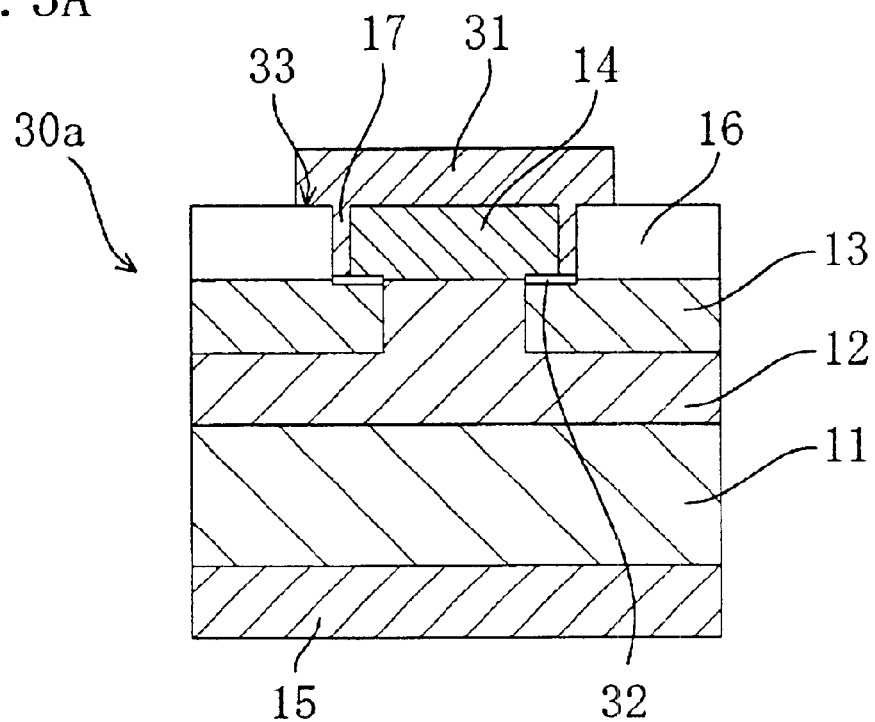
FIG. 3A and FIG. 3B are cross-sectional views illustrating semiconductor devices according to the first and second structure variations, respectively, of the first embodiment.
Figure 3B:
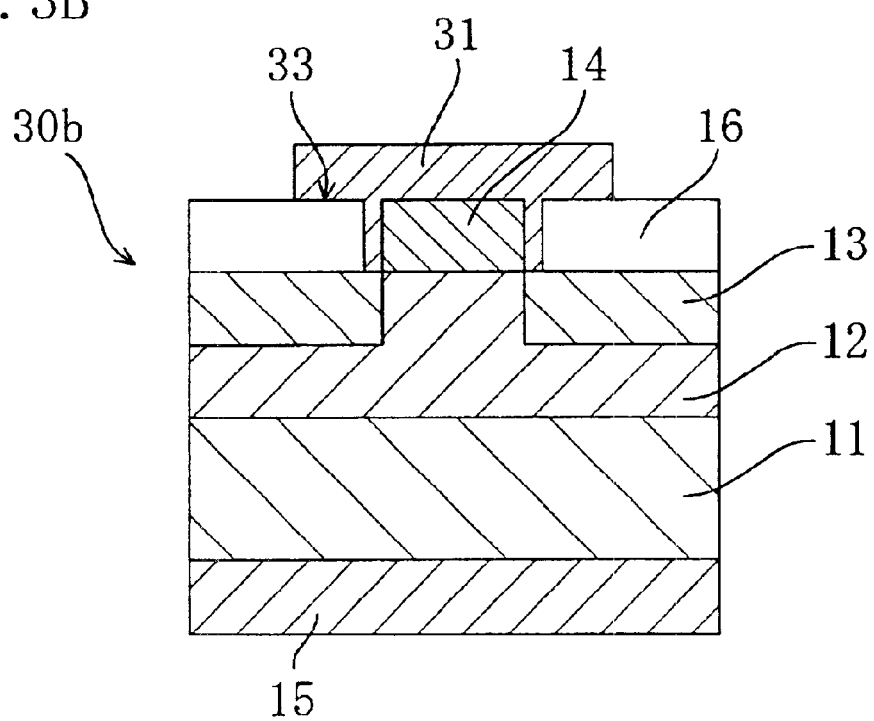

FIG. 3A and FIG. 3B are cross-sectional views illustrating semiconductor devices according to the first and second structure variations, respectively, of the first embodiment.

As illustrated in FIG. 3A and FIG. 3B, in each of the first and second variations, an upper metal electrode 31 is provided on the Schottky electrode 14. The other elements of Schottky diodes 30a and 30b of these variations are the same as those of the Schottky diode 10 of the first embodiment, and they are provided with the same reference numerals as those in FIG. 1 and will not be further described below.

As illustrated in FIG. 3A, in the Schottky diode 30a of the first structure variation, the Schottky electrode 14 extends over the non-ion-implanted region of the 4H—SiC layer 12 and the ion implantation layer 13, as in the first embodiment, with the upper metal electrode 31 being formed so as to cover the Schottky electrode 14. The other elements of the Schottky diode 30a of this variation are the same as those of the Schottky diode 10 of the first embodiment, and they are provided with the same reference numerals as those in FIG. 1 and will not be further described below. In this variation, the Schottky electrode 14 is in contact with both the ion implantation layer 13 and the non-ion-implanted region of the 4H—SiC layer 12, but the insulative layer 16 and the Schottky electrode 14 are not in contact with each other, with the upper metal electrode 31 covering at least a portion of the insulative layer 16. If the Schottky electrode 14 is subjected to a heat treatment at a desired temperature in advance, and the upper metal electrode 31 is then formed thereon, a stable Schottky interface is formed between the 4H—SiC layer 12 and the Schottky electrode 14, whereby a heat treatment is not necessary after the formation of the upper metal electrode 31. Therefore, even if the upper metal electrode 31 extends into the gap 17 between the Schottky electrode 14 and the insulative layer 16, formation of an altered layer between the insulative layer 16 and the upper metal electrode 31 almost never occurs.

Moreover, since it is necessary to form a Schottky barrier between the Schottky electrode 14 and the 4H—SiC layer 12, the variety of types of metal materials used in the Schottky electrode 14 is somewhat limited, but the type of metal material used in the upper metal electrode 31 is not limited, whereby a material that is unlikely to form an altered layer with the insulative layer 16 can be easily selected.

Note that in the first variation illustrated in FIG. 3A, it is preferred that the area of a contact portion 32 between the Schottky electrode 14 and the ion implantation layer 13 is small. This is because if the ion implantation layer 13 is subjected to a heat treatment at a low temperature, a leak current, though in a slight amount, from the contact portion 32 is observed in some cases. On the other hand, it is preferred that the area of a contact portion 33 between the upper metal electrode 31 and the insulative layer 16 is large. With the upper metal electrode 31 covering a portion of the insulative layer 16, the contact portion 33 between the upper metal electrode 31 and the insulative layer 16 functions to reduce the localization of an electric field, whereby the slight amount of leak current through the guard ring section can be further reduced by the presence of the insulative layer 16 on the ion implantation layer 13.

In the Schottky diode 30b of the second structure variation illustrated in FIG. 3B, the Schottky electrode 14 is in contact only with the non-ion-implanted region of the 4H—SiC layer 12, and is not in contact with the ion implantation layer 13. In the second variation, the leak current can be reduced more effectively.

Second Embodiment

Figure 4:
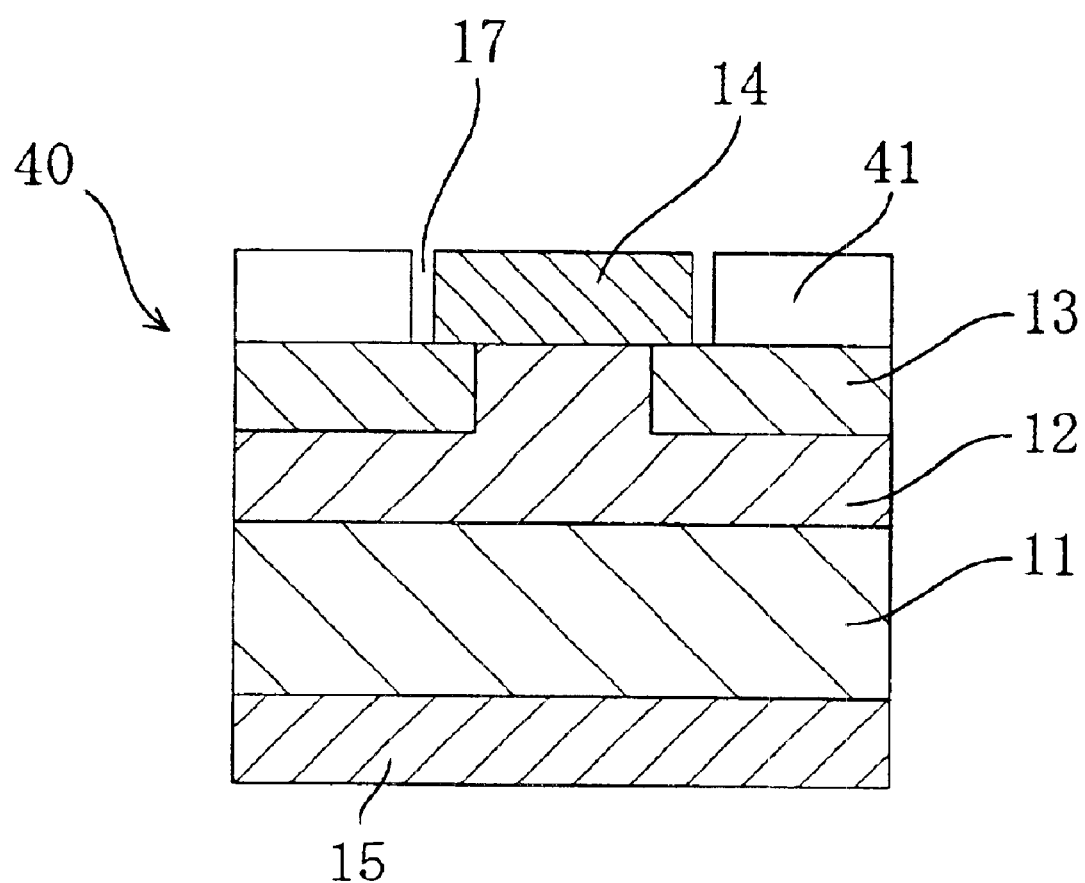
FIG. 4 is a cross-sectional view illustrating a Schottky diode according to the second embodiment of the present invention.

FIG. 4 is a cross-sectional view illustrating a semiconductor device (Schottky diode) according to the second embodiment of the present invention. As illustrated in FIG. 4, a Schottky diode 40 of the present embodiment includes, instead of the insulative layer 16 made of a thermal oxide film of the first embodiment, an insulative layer 41 made of an SiO$_2$ film produced by a thermal CVD method. The other elements of the Schottky diode 40 of the present embodiment are the same as those of the Schottky diode 10 of the first embodiment, and they are provided with the same reference numerals as those in FIG. 1 and will not be further described below.

Also in the present embodiment, the Schottky electrode 14 and the insulative layer 41 are not in contact with each other, with the gap 17 being provide therebetween, whereby the altered layers 88 or 93, 94 occurring in the conventional Schottky diode 80 or 90 as illustrated in FIG. 8 or FIG. 9 does not occur. Therefore, with the Schottky diode 40 of the present embodiment, it is possible to suppress the occurrence of a leak current.

Next, a method for manufacturing a Schottky diode of the present embodiment will be described with reference to FIG. 5A to FIG. 5E.

Figure 5A:
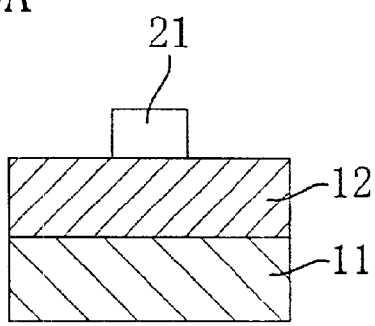
FIG. 5A to FIG. 5E are cross-sectional views illustrating a method for manufacturing the Schottky diode according to the second embodiment.
Figure 5B:
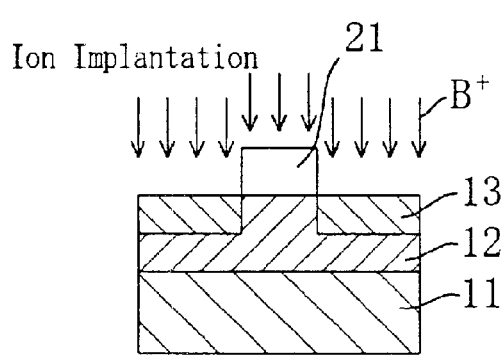

The steps shown in FIG. 5A and FIG. 5B are the same as those of the first embodiment shown in FIG. 2A and FIG. 2B, and thus will not be described below.

Figure 5C:
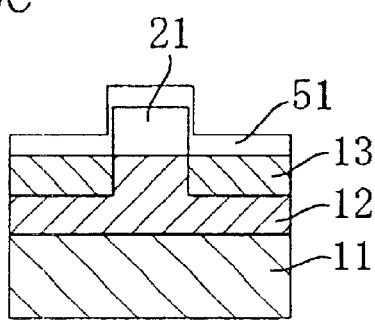

According to the present embodiment, in the step shown in FIG. 5C, the substrate is introduced into a resistance heating furnace with the $SiO_2$ mask 21 being left thereon, and a heat treatment is performed in a nitrogen atmosphere in the resistance heating furnace at 1100° C. for 90 minutes so as to activate boron implanted in the ion implantation layer 13.

Then, using a CVD apparatus, an $SiO_2$ film 51 having a thickness of about 200 nm is deposited on the ion implantation layer 13 and the $SiO_2$ mask 21 by a thermal CVD method, as illustrated in FIG. 5C. In the thermal CVD process, a silane gas and dinitrogen monoxide are used, and the substrate temperature is kept at about 850° C.

Figure 5D:
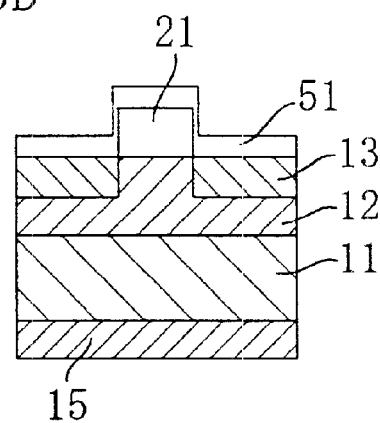

Then, in the step shown in FIG. 5D, a nickel film (Ni film) having a thickness of 400 nm is deposited on the reverse surface of the 4H—SiC substrate 11. The substrate having the Ni film deposited thereon is subjected to a heat treatment in a nitrogen atmosphere at 1000° C. for 5 minutes so as to form the ohmic electrode 15 made of Ni.

Figure 5E:
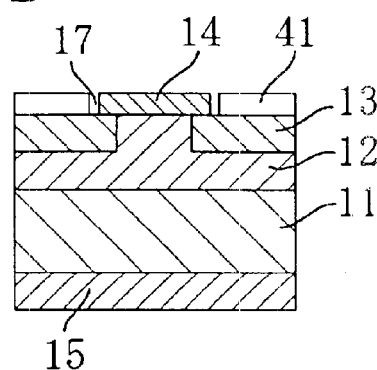

Then, in the step shown in FIG. 5E, a lift-off process as that shown in FIG. 2E to FIG. 2H is performed so as to form the Schottky electrode 14 that extends over the non-ion-implanted region of the 4H—SiC layer 12 and the ion implantation layer 13. Moreover, the $SiO_2$ film 51 is patterned so as to form the insulative layer 41. As a result of this process, the gap 17 having a size of 2 $\mu$m is provided between the insulative layer 41 and the Schottky electrode 14 so as to separate them from each other. Then, the substrate is subjected to a heat treatment in a nitrogen atmosphere at 400° C. for 5 minutes, whereby a Schottky barrier is reliably formed between the Schottky electrode 14 and the 4H—SiC layer 12.

According to the present embodiment, as in the first embodiment, the gap 17 having a uniform dimension can be reliably formed between the insulative layer 41 and the Schottky electrode 14 in a self-aligned process.

Experiment

The following experiment was conducted in order to confirm the effects of the present embodiment. In the following description, the Schottky diode of the second embodiment will be referred to simply as "diode C".

Diode C was also evaluated for the I-V characteristics. There was substantially no difference between the forward I-V characteristics of diode C and those of diodes A and B. The reverse I-V characteristics of diode C were desirable as those of diode A, and the percentage of devices that broke down upon application of a reverse voltage of –600 V was 10% or less. The breakdown is not due to the structure of the Schottky diode, but due to defects in the crystal of the semiconductor substrate 11 or the 4H—SiC layer 12.

For diode B, the ion implantation layer is activated at a relatively low temperature of 1100° C., whereby the damage caused by the ion implantation remains in the ion implantation layer, and the crystal defects are not completely restored. It is believed that in such a state, if the altered layer 88 as illustrated in FIG. 8 is in contact with the ion implantation layer 83, an electric field is likely to be localized in the area, which may cause a local leak current, whereby the device is likely to break down. In contrast, for diode C, it is believed that the insulative layer 41 and the Schottky electrode 14 are not in contact with each other, as illustrated in FIG. 4, whereby an altered layer is not formed, resulting in the low breakdown probability.

First Process Variation of Second Embodiment

In the second embodiment, the $SiO_2$ film is formed by using a CVD apparatus after subjecting the ion implantation layer 13 to a heat treatment at 1100° C. Alternatively, the heat treatment step and the $SiO_2$ film formation step may be performed in the same apparatus. For example, according to the first process variation of the second embodiment, after the ion implantation layer 13 is formed as illustrated in FIG. 5B in the process of manufacturing a Schottky diode according to the second embodiment, the substrate is introduced into a CVD apparatus. Then, an inert gas such as argon or nitrogen is introduced into the CVD apparatus, and the temperature is increased to 1100° C. and then kept at 1100° C. for a predetermined period of time. The ion implantation layer 13 is activated through such a heat treatment. Then, the inert gas atmosphere is substituted with a reactant gas atmosphere containing silane or dinitrogen monoxide, and the process directly transitions to the $SiO_2$ film formation step. In this way, the ion implantation layer 13 and the $SiO_2$ film 51 are formed successively. Thus, the manufacturing process can be shortened.

Second Process Variation of Second Embodiment

In the first process variation of the second embodiment, the heat treatment step for the ion-implanted 4H—SiC layer and the $SiO_2$ film formation step are performed in the same apparatus. Alternatively, the heat treatment step and the $SiO_2$ film formation step may be performed simultaneously. For example, according to the second process variation of the second embodiment, after the ion implantation layer 13 is formed as illustrated in FIG. 5B in the process of manufacturing a Schottky diode as set forth in the first process variation of the second embodiment, the substrate is introduced into a CVD apparatus, and the $SiO_2$ film is deposited at a predetermined temperature in the reactant-gas-containing atmosphere without changing the atmosphere. In this way, the formation of the $SiO_2$ film 51 and the activation of the ion implantation layer 13 (through the heating for the $SiO_2$ film formation) are performed simultaneously. Thus, the manufacturing process can be further shortened. Of course, if the heat treatment time is insufficient, an additional heat treatment may be performed with the reactant gas atmosphere being substituted with an inert gas atmosphere, for example. If the heat treatment temperature is too low, an additional heat treatment may be performed while increasing the temperature to a desired temperature.

Moreover, in the method for manufacturing a semiconductor device of the present embodiment, the heat treatment process and the thermal CVD process after ion implantation are performed at 1100° C. and 850° C., respectively. If a general-purpose resistance heating furnace or a general-purpose ramp annealing apparatus can be used, it is not necessary to use any other special-purpose heating apparatus. In view of this, it is preferred that the heat treatment process and the $SiO_2$ film formation process after ion implantation are performed at a temperature of 1200° C. or less.

Moreover, while the insulative layer is made of an $SiO_2$ film in the second embodiment and the first and second process variations thereof, the insulative layer may alternatively be made of another insulative material.

Moreover, while the SiO₂ film 51 forming an insulative layer is produced by a thermal CVD method in the second embodiment, a plasma CVD method, a sputtering method or any other appropriate deposition method may alternatively be used.

First and Second Structure Variation of Second Embodiment

Figure 6A:
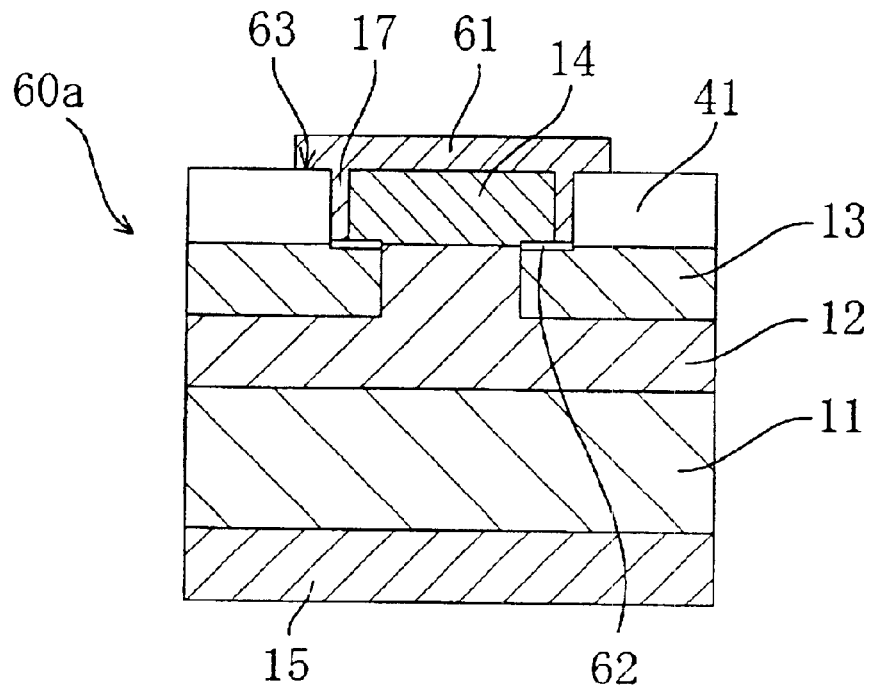
FIG. 6A and FIG. 6B are cross-sectional views illustrating semiconductor devices according to the first and second structure variations, respectively, of the second embodiment.
Figure 6B:
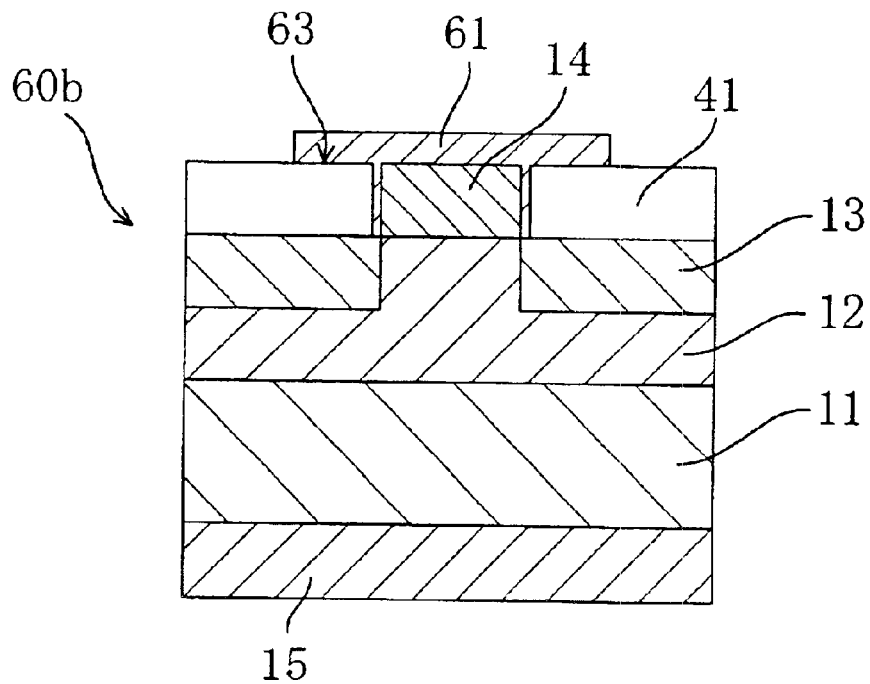

FIG. 6A and FIG. 6B are cross-sectional views illustrating semiconductor devices according to the first and second structure variations, respectively, of the second embodiment.

As illustrated in FIG. 6A and FIG. 6B, in each of the first and second variations, an upper metal electrode 61 is provided on the Schottky electrode 14. The other elements of Schottky diodes 60a and 60b of these variations are the same as those of the Schottky diode 40 of the second embodiment, and they are provided with the same reference numerals as those in FIG. 4 and will not be further described below.

As illustrated in FIG. 6A, in the Schottky diode 60a of the first structure variation, the Schottky electrode 14 extends over the 4H—SiC layer 12 and the ion implantation layer 13, as in the second embodiment, with the upper metal electrode 61 being formed so as to cover the Schottky electrode 14. In this variation, the Schottky electrode 14 is in contact with both the ion implantation layer 13 and the non-ion-implanted region of the 4H—SiC layer 12, but the insulative layer 41 and the Schottky electrode 14 are not in contact with each other, with the upper metal electrode 61 covering at least a portion of the insulative layer 41. If the Schottky electrode 14 is subjected to a heat treatment at a desired temperature in advance, and the upper metal electrode 61 is then formed thereon, a stable Schottky interface is formed between the 4H—SiC layer 12 and the Schottky electrode 14, whereby a heat treatment is not necessary after the formation of the upper metal electrode 61. Therefore, even if the upper metal electrode 61 extends into the gap 17 between the Schottky electrode 14 and the insulative layer 41, formation of an altered layer between the insulative layer 41 and the upper metal electrode 61 almost never occurs.

Moreover, since it is necessary to form a Schottky barrier between the Schottky electrode 14 and the 4H—SiC layer 12, the variety of types of metal materials used in the Schottky electrode 14 is somewhat limited, but the type of metal material used in the upper metal electrode 61 is not limited, whereby a material that is unlikely to form an altered layer with the insulative layer 41 can be easily selected.

Note that in the first variation illustrated in FIG. 6A, it is preferred that the area of a contact portion 62 between the Schottky electrode 14 and the ion implantation layer 13 is small. This is because if the ion implantation layer 13 is subjected to a heat treatment at a low temperature, a leak current, though in a slight amount, from the contact portion 62 is observed in some cases. On the other hand, it is preferred that the area of a contact portion 63 between the upper metal electrode 61 and the insulative layer 41 is large. With the upper metal electrode 61 covering a portion of the insulative layer 41, the contact portion 63 between the upper metal electrode 61 and the insulative layer 41 functions to reduce the localization of an electric field, whereby the slight amount of leak current through the guard ring section can be further reduced by the presence of the insulative layer 41 on the ion implantation layer 13.

In the Schottky diode 60b of the second structure variation illustrated in FIG. 6B, the Schottky electrode 14 is in contact only with the 4H—SiC layer 12, and is not in contact with the ion implantation layer 13. In the second variation, the leak current can be reduced more effectively.

Note that in the semiconductor devices and the manufacturing methods therefor described above in the first and second embodiments, the non-ion-implanted region of the 4H—SiC layer 12 is the surface along which the Schottky electrode contacts silicon carbide. Therefore, it is necessary to avoid, as much as possible, contamination of the region with dust, an impurity, etc. In view of this, if the surface of the 4H—SiC layer 12 may be covered by a protection layer before the formation of the Schottky electrode in the process of manufacturing the semiconductor device. Then, the protection layer can be removed immediately before the step of forming the Schottky electrode, so as to remove any dust or an impurity that has been introduced during the process. In the first and second embodiments, in the step of forming the insulative layer, the SiO₂ mask 21, which is a protection film, is present on the 4H—SiC layer 12 to which ion has not been implanted, whereby the surface of the 4H—SiC layer 12 can be kept clean.

Particularly, in the manufacturing methods of the first and second embodiments, the SiO₂ mask 21, which is a protection film, also functions as an ion implantation mask, thereby simplifying the process.

Particularly, in the first embodiment, when the thermal oxide film 23 to be the insulative layer 16 is formed, the SiO₂ mask, which is a protection film, is present on the 4H—SiC layer 12 to which ion has not been implanted, whereby it is possible to suppress the thermal oxidization of a surface portion of the 4H—SiC layer 12 that is in contact with the Schottky electrode 14. If the surface portion of the 4H—SiC layer 12 to which ion has not been implanted is directly thermally oxidized, the thermal oxide film needs to be removed before the formation of the Schottky electrode 14. However, if significant defects such as micropipe ends are present on the upper surface of the 4H—SiC layer 12, removal of the thermal oxide film will expand the defective area. Then, the defective area may further increase the occurrence of a leak current when the Schottky electrode is formed subsequently. Therefore, it is preferred that the upper surface of the 4H—SiC layer 12 is covered by a protection film when the thermal oxide film is formed.

Third Embodiment

Figure 7:
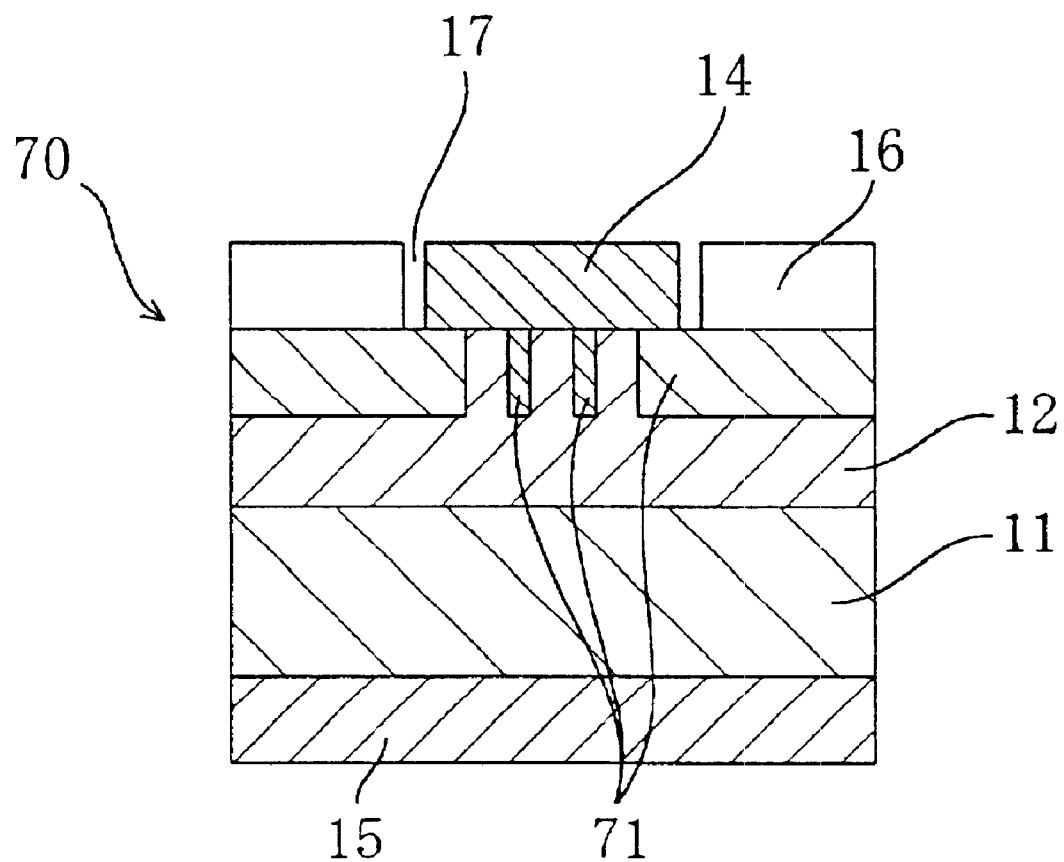
FIG. 7 is a cross-sectional view illustrating a Schottky diode according to the third embodiment of the present invention.

FIG. 7 is a cross-sectional view illustrating a semiconductor device (Schottky diode) according to the third embodiment of the present invention. As illustrated in FIG. 7, a Schottky diode 70 of the present embodiment includes an ion implantation layer 71 that has discrete portions under a central portion of the Schottky electrode 14. The other elements of the Schottky diode 70 of the present embodiment are the same as those of the Schottky diode 10 of the first embodiment, and they are provided with the same reference numerals as those in FIG. 1 and will not be further described below.

Also in the present embodiment, the Schottky electrode 14 and the insulative layer 16 are not in contact with each other, with the gap 17 being provide therebetween, whereby the altered layers 88 or 93, 94 occurring in the conventional Schottky diode 80 or 90 as illustrated in FIG. 8 or FIG. 9 does not occur. Therefore, with the Schottky diode 70 of the present embodiment, it is possible to suppress the occurrence of a leak current.

Moreover, also in the present embodiment, the structure variations with the upper metal electrode 31 illustrated in FIG. 3A and FIG. 3B may be employed.

Alternative Embodiments

In the semiconductor devices and the manufacturing methods therefor described above in the first and second embodiments, a 4H—SiC substrate is used as a semiconductor substrate. Alternatively, the semiconductor substrate may be a 6H—SiC substrate, a 15R—SiC substrate, or an Si substrate. Moreover, instead of the 4H—SiC layer, a 15R—SiC layer epitaxially grown on a 15R—SiC substrate, or a 3C—SiC layer epitaxially grown on an Si substrate may be used as a semiconductor layer. Of course, any other combination may be employed, and a layered structure including two or more layers may be employed. For example, a substrate including an insulative substrate and an SiC layer (semiconductor layer) epitaxially grown on the insulative substrate may be employed. These and other alternatives may be employed as long as the Schottky electrode is formed on the SiC layer.

In the first and second embodiments, the dimension of the gap 17 between the insulative layer 16 and the Schottky electrode 14 is preferably 0.1 μm or more, because it will be difficult to reliably prevent the formation of an altered layer if the dimension of the gap 17 is about 0.1 μm or less. In order to more reliably prevent the formation of an altered layer, it is preferred that the dimension of the gap 17 is 0.5 μm or more. On the other hand, in order to reliably perform the lift-off process, the gap 17 is preferably 20 μm or less, and more preferably 10 μm or less. Thus, the dimension of the gap 17 is preferably in the range of 0.1 μm to 20 μm, and more preferably in the range of 0.5 μm to 10 μm.

In the semiconductor devices and the manufacturing methods therefor described above in the first and second embodiments, Ni is used as a material of the ohmic electrode and the Schottky electrode. Alternatively, any other material may be employed for each of these electrodes as long as the ohmic characteristics and the Schottky characteristics, respectively, can be obtained.

In the semiconductor devices and the manufacturing methods therefor described above in the first and second embodiments, a multi-layer electrode may be employed, instead of a single-layer electrode, for the Schottky electrode and the ohmic electrode. Moreover, these electrodes are not limited to any particular size.

In the semiconductor devices and the manufacturing methods therefor described above in the first and second embodiments, a lift-off method is used as the method for forming the Schottky electrode. Of course, any other method may be used.

In the processes of manufacturing a semiconductor device of the first and second embodiments, process conditions and gas species other than those described above may alternatively be employed.

Moreover, in the semiconductor devices and the manufacturing methods therefor described above in the first and second embodiments, boron is used as the ion implantation species. Of course, any other ion implantation species may be employed as long as the ion implantation layer is a high-resistance layer.

In the manufacturing processes of the first and second embodiments, the heat treatment process and the thermal oxidization process after ion implantation are performed at 1200° C. or less. However, as long as the insulative layer and the Schottky electrode are not in contact with each other in the resultant structure, it is possible to prevent the formation of an altered layer even if a heat treatment after ion implantation is performed at a temperature higher than 1200° C. For example, even if a heat treatment is performed at a temperature of 1500° C. or more after ion implantation, the formation of an altered layer can be prevented by the structure or the manufacturing method of the first or second embodiment.

Furthermore, the semiconductor device of the present invention is not limited to a Schottky diode, but may alternatively be any other device such as a transistor as long as the device has a structure that reduces the localization of an electric field by ion implantation.

Furthermore, the method for manufacturing a semiconductor device of the present invention may of course be applied to a semiconductor device having any other structure. For example, the manufacturing method of the first or second embodiment may be employed for manufacturing a semiconductor device having the conventional structure as illustrated in FIG. 9, in which case the need for a high-temperature heat treatment is eliminated, whereby the process of manufacturing a semiconductor device can be simplified and the throughput can be improved, while reducing the leak current.

What is claimed is:

1. A semiconductor device, comprising:

a semiconductor layer made of silicon carbide;

an ion implantation layer formed by implanting ion into the semiconductor layer;

a Schottky electrode formed at least on a region of the semiconductor layer that excludes the ion implantation layer;

an insulative layer formed on and in contact with the ion implantation layer with a predetermined gap between the insulative layer and the Schottky electrode, and an upper metal electrode filling the gap and covering the top surface and the side surfaces of the Schottky electrode.

2. The semiconductor device of claim 1, wherein the Schottky electrode is formed so as to extend over a region of the ion implantation layer.

3. The semiconductor device of claim 1, wherein the upper metal electrode covers at least a portion of the oxide layer.

4. The semiconductor device of claim 1, wherein the Schottky electrode is not in contact with the ion implantation layer.

5. The semiconductor device of claim 1, wherein the Schottky electrode is subjected to a heat treatment.

6. The semiconductor device of claim 1, further comprising a substrate made of silicon carbide, wherein the semiconductor layer is epitaxially grown on the substrate.

7. The semiconductor device of claim 1, further comprising a substrate made of Si, wherein the semiconductor layer is epitaxially grown on the substrate.

8. The semiconductor device of claim 1, wherein the semiconductor device functions as a Schottky diode.

9. The semiconductor device of claim 1, wherein the region of the semiconductor layer that excludes the ion implantation layer is an n-type region, and a Schottky junction is formed between the Schottky electrode and the n-type region.

10. A semiconductor device, comprising:

a semiconductor layer made of silicon carbide;

an ion implantation layer formed by implanting ion into the semiconductor layer;

a Schottky electrode formed at least on a region of the semiconductor layer that excludes the ion implantation layer; and an insulative layer formed on and in contact with the ion implantation layer with a predetermined gap between the insulative layer and the Schottky electrode, wherein the region of the semiconductor layer that excludes the ion implantation layer is an n-type region, and a Schottky junction is formed between the Schottky electrode and the n-type region.

11. The semiconductor device of claim 10, wherein the Schottky electrode is formed so as to extend over the n-type region and the ion implantation layer.

12. The semiconductor device of claim 10, further comprising an upper metal electrode formed on the Schottky electrode so as to be in contact with the Schottky electrode.

13. The semiconductor device of claim 12, wherein the upper metal electrode covers at least a portion of the insulative layer.

14. The semiconductor device of claim 10, wherein the Schottky electrode is not in contact with the ion implantation layer.

15. The semiconductor device of claim 10, wherein the Schottky electrode is subjected to a heat treatment.

16. The semiconductor device of claim 10, further comprising a substrate made of silicon carbide, wherein the semiconductor layer is epitaxially grown on the substrate.

17. The semiconductor, device of claim 10, further comprising a substrate made of Si, wherein the semiconductor layer is epitaxially grown on the substrate.

18. The semiconductor device of claim 10, wherein the semiconductor device functions as a Schottky diode.

19. A semiconductor device, comprising:
   a semiconductor layer made of silicon carbide;
   an ion implantation layer formed by implanting ion into the semiconductor layer;
   a Schottky electrode formed at least on a region of the semiconductor layer that excludes the ion implantation layer; and
   an insulative layer formed on and in contact with the ion implantation layer with a predetermined gap between the insulative layer and the Schottky electrode,
   wherein the gap is a physical space.

20. The semiconductor device of claim 19, wherein the Schottky electrode is formed so as to extend over a region of the ion implantation layer.

21. The semiconductor device of claim 19, wherein the Schottky electrode is not in contact with the ion implantation layer.

22. The semiconductor device of claim 19, wherein the Schottky electrode is subjected to a heat treatment.

23. The semiconductor device of claim 19, further comprising a substrate made of silicon carbide, wherein the semiconductor layer is epitaxially grown on the substrate.

24. The semiconductor device of claim 19, further comprising a substrate made of Si, wherein the semiconductor layer is epitaxially grown on the substrate.

25. The semiconductor device of claim 10, wherein the n-type region is provided on an n-type semiconductor substrate.

* * * * *

UNITED STATES PATENT AND TRADEMARK OFFICE
CERTIFICATE OF CORRECTION

PATENT NO. : 6,900,483 B2
APPLICATION NO. : 10/162503
DATED : May 31, 2005
INVENTOR(S) : Masao Uchida et al.

Page 1 of 1

It is certified that error appears in the above-identified patent and that said Letters Patent is hereby corrected as shown below:

<u>Title page,</u>

Item (75) Inventors:

"Masao Uchida, Ibaraki (JP);" should be --Masao Uchida, Osaka (JP);--

"Kunimasa Takahashi, Ibaraki (JP);" should be --Kunimasa Takahashi, Osaka (JP);--

"Kenya Yamashita, Kadoma (JP);" should be --Kenya Yamashita, Osaka (JP);--.

Signed and Sealed this

Eleventh Day of July, 2006

JON W. DUDAS
*Director of the United States Patent and Trademark Office*

UNITED STATES PATENT AND TRADEMARK OFFICE
CERTIFICATE OF CORRECTION

PATENT NO. : 6,900,483 B2
APPLICATION NO. : 10/162503
DATED : May 31, 2005
INVENTOR(S) : Masao Uchida et al.

It is certified that error appears in the above-identified patent and that said Letters Patent is hereby corrected as shown below:

In the Drawings:

Delete page 3/8 and substitute the attached page 3/8.

Delete page 6/8 and substitute the attached page 6/8.

Signed and Sealed this

Fifth Day of December, 2006

JON W. DUDAS
*Director of the United States Patent and Trademark Office*